US007239537B2

(12) United States Patent
DeBrosse et al.

(10) Patent No.: US 7,239,537 B2
(45) Date of Patent: Jul. 3, 2007

(54) METHOD AND APPARATUS FOR CURRENT SENSE AMPLIFIER CALIBRATION IN MRAM DEVICES

(75) Inventors: John K. DeBrosse, Colchester, VT (US); Dietmar Gogl, Essex Junction, VT (US); Stefan Lammers, Heek (DE); Hans Viehmann, Muchen (DE)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 10/905,585

(22) Filed: Jan. 12, 2005

(65) Prior Publication Data

US 2006/0152970 A1    Jul. 13, 2006

(51) Int. Cl.
*G11C 11/00*    (2006.01)
(52) U.S. Cl. .................. 365/154; 365/158; 365/207
(58) Field of Classification Search ............... 365/158, 365/207, 185.21, 189.07, 189.09, 104, 154
See application file for complete search history.

(56) References Cited

U.S. PATENT DOCUMENTS

| 4,305,135 A | 12/1981 | Dahl et al. |
| 5,142,495 A * | 8/1992 | Canepa ................ 365/185.2 |
| 5,237,533 A | 8/1993 | Papaliolios |
| 5,621,310 A | 4/1997 | Cosgrove et al. |
| 5,920,187 A | 7/1999 | Cosgrove et al. |
| 6,219,290 B1 * | 4/2001 | Chang et al. ............... 365/207 |
| 6,396,339 B1 * | 5/2002 | Jacobs ........................ 330/9 |
| 6,504,779 B2 | 1/2003 | Perner |
| 6,714,464 B2 | 3/2004 | Bhatia et al. |
| 6,735,122 B2 | 5/2004 | Roohparvar |
| 2004/0218446 A1 | 11/2004 | Gogl et al. |
| 2006/0050584 A1 | 3/2006 | Gogl et al. |

OTHER PUBLICATIONS

Dietmar Gogl; "Self-Calibrated MRAM Sense Amplifier," [online]; [retrived on Jul. 23, 2004 at http://prioart.ip.com/viewPub.jsp.

* cited by examiner

*Primary Examiner*—Richard T. Elms
*Assistant Examiner*—Dang Nguyen
(74) *Attorney, Agent, or Firm*—Cantor Colburn LLP

(57) ABSTRACT

A calibrated magnetic random access memory (MRAM) current sense amplifier includes a first plurality of trim transistors selectively configured in parallel with a first load device, the first load device associated with a data side of the sense amplifier. A second plurality of trim transistors is selectively configured in parallel with a second load device, the second load device associated with a reference side of the sense amplifier. The first and said second plurality of trim transistors are individually activated so as to compensate for device mismatch with respect to the data and reference sides of the sense amplifier.

12 Claims, 3 Drawing Sheets

METHOD AND APPARATUS FOR CURRENT SENSE AMPLIFIER CALIBRATION IN MRAM DEVICES

BACKGROUND

The present invention relates generally to magnetic random access memory devices, and, more particularly, to a method and apparatus for current sense amplifier calibration in MRAM devices.

Magnetic (or magneto-resistive) random access memory (MRAM) is a non-volatile random access memory technology that could potentially replace the dynamic random access memory (DRAM) as the standard memory for computing devices. The use of MRAM as a non-volatile RAM will eventually allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive, or TMR device) includes a structure having ferromagnetic layers separated by a non-magnetic layer (barrier), and arranged into a magnetic tunnel junction (MTJ). Digital information is stored and represented in the memory element as directions of magnetization vectors in the magnetic layers. More specifically, the magnetic moment of one magnetic layer (also referred to as a reference layer) is fixed or pinned, while the magnetic moment of the other magnetic layer (also referred to as a "free" layer) may be switched between the same direction and the opposite direction with respect to the fixed magnetization direction of the reference layer. The orientations of the magnetic moment of the free layer are also known as "parallel" and "antiparallel" states, wherein a parallel state refers to the same magnetic alignment of the free and reference layers, while an antiparallel state refers to opposing magnetic alignments therebetween.

Depending upon the magnetic state of the free layer (parallel or antiparallel), the magnetic memory element exhibits two different resistance values in response to a voltage applied across the tunnel junction barrier. The particular resistance of the TMR device thus reflects the magnetization state of the free layer, wherein resistance is "low" when the magnetization is parallel, and "high" when the magnetization is antiparallel. Accordingly, a detection of changes in resistance allows a MRAM device to provide information stored in the magnetic memory element (i.e., a read operation).

In a 1-transistor, 1-MTJ type MRAM device, a column selector circuit is used to connect the device's regular (data) bit lines and reference bit lines with the input of a current sense amplifier (SA). During sensing, the SA maintains the voltage at the selected bitlines constant, and measures the current at the selected bitlines/reference bitlines. The magnitude of current at the selected bitlines is dependent on the programming state "0" or "1" of the selected memory cells. In order to keep the voltage at the selected bitlines approximately constant, a bitline voltage clamp is used. A comparator within the sense amplifier compares the voltage at a load device of the data cell being read with the voltage at a load device(s) of a reference bitline (or bitlines) and creates a digital output signal dependent on the programming state of the selected memory cell.

Unfortunately, a basic shortcoming of sense amplifiers, such as those used in MRAM devices, is the input offset current (or voltage) created by individual device mismatch within the sense amplifier. The device mismatch in turn creates a slight imbalance in the comparator input, with respect to the differential between the data signal and the reference signal, thus slightly biasing the sense amplifier toward a "1" state or a "0" state. Accordingly, it would be desirable to be able to compensate for any such imbalance/mismatch in the sense amplifier devices in order to improve the yield that would otherwise be lost due to the lack of signal margin.

SUMMARY

The foregoing discussed drawbacks and deficiencies of the prior art are overcome or alleviated by a method for calibrating an MRAM current sense amplifier. In an exemplary embodiment, the method includes configuring a first plurality of trim transistors in parallel with a first load device, the first load device associated with a data side of the sense amplifier, and configuring a second plurality of trim transistors in parallel with a second load device, the second load device associated with a reference side of the sense amplifier. One or more of the first and said second plurality of trim transistors are individually activated so as to compensate for a determined device mismatch with respect to the data and reference sides of the sense amplifier.

In another embodiment, a calibrated magnetic random access memory (MRAM) sense amplifier includes a first plurality of trim transistors selectively configured in parallel with a first load device, the first load device associated with a data side of the sense amplifier. A second plurality of trim transistors is selectively configured in parallel with a second load device, the second load device associated with a reference side of the sense amplifier. The first and said second plurality of trim transistors are individually activated so as to compensate for device mismatch with respect to the data and reference sides of the sense amplifier.

In another embodiment, a method for calibrating an MRAM current sense amplifier includes configuring a first plurality of trim transistors in parallel with a first side of a current mirror device within a comparator, the first side of the current mirror device associated with a data side of the sense amplifier, and configuring a second plurality of trim transistors in parallel with a second side of the current mirror device, the second side associated with a reference side of the sense amplifier. One or more of the first and said second plurality of trim transistors is individually activated so as to compensate for a determined device mismatch with respect to the data and reference sides of the sense amplifier.

In still another embodiment, a calibrated magnetic random access memory (MRAM) current sense amplifier includes a first plurality of trim transistors selectively configured in parallel with a first side of a current mirror device within a comparator, the first side of said current mirror device associated with a data side of the sense amplifier. A second plurality of trim transistors is selectively configured in parallel with a second side of the current mirror device, the second side associated with a reference side of the sense amplifier. The first and said second plurality of trim transistors are individually activated so as to compensate for device mismatch with respect to the data and reference sides of the sense amplifier.

BRIEF DESCRIPTION OF THE DRAWINGS

Referring to the exemplary drawings wherein like elements are numbered alike in the several Figures.

DETAILED DESCRIPTION

Figure 1:
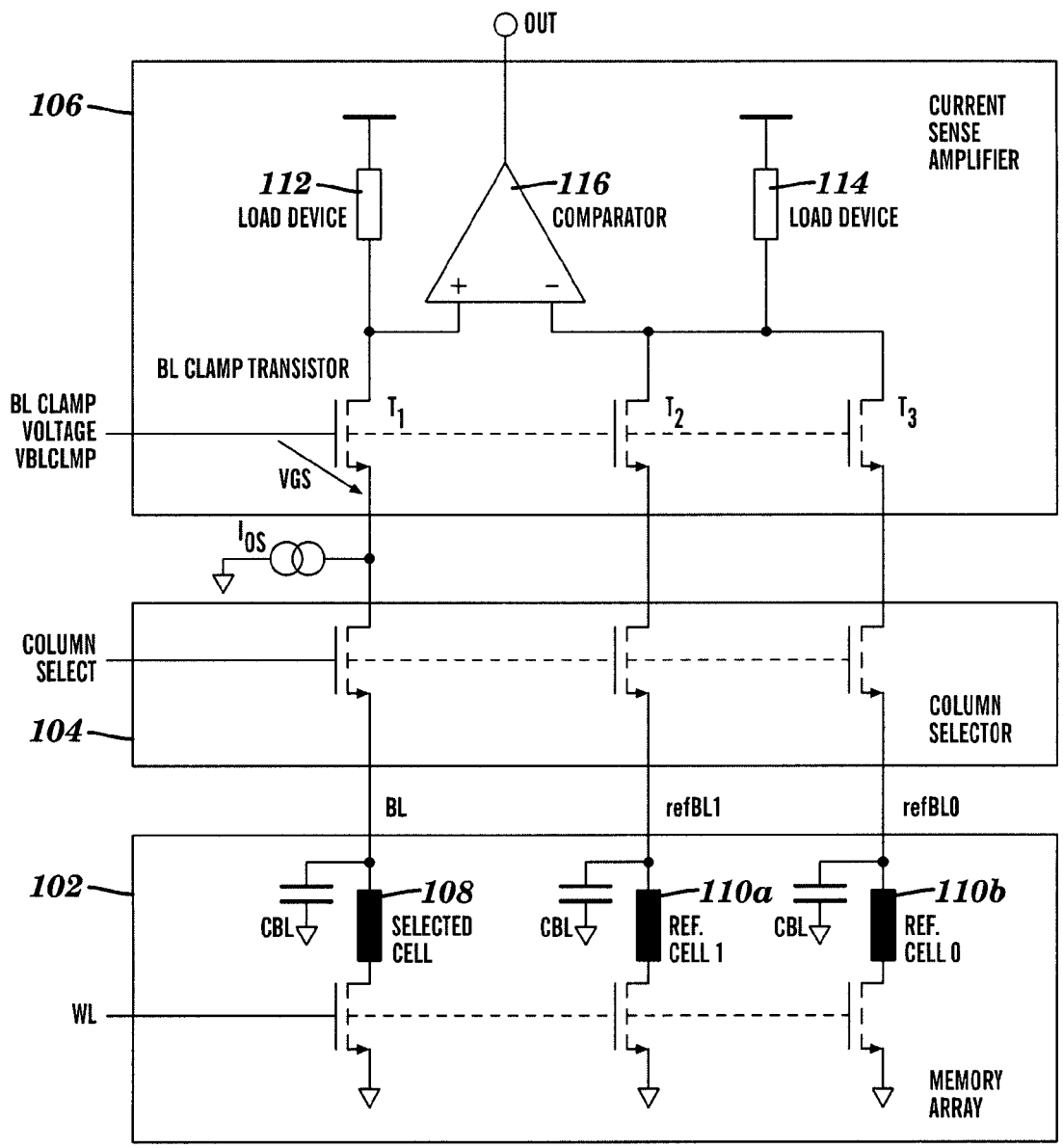
FIG. 1 is a schematic diagram of a MRAM device suitable for use in accordance with an embodiment of the invention.

Referring initially to FIG. 1, there is shown a schematic diagram of a MRAM device 100 suitable for use in accordance with an embodiment of the invention. In particular, the device 100 of FIG. 1 is a 1-transistor, 1-MTJ (1T1MTJ) type MRAM device, which generally includes a memory array circuit 102, column selector circuit 104, and current sense amplifier circuit 106. The memory array 102 in turn includes a plurality of data cells 108, as well as one or more reference cells 110a, 110b. In the exemplary device depicted, the first reference cell 110a stores a "1" state within the tunnel junction thereof, while a second reference cell 110b stores a "0" state within the tunnel junction thereof.

The column selector circuit 104 connects the regular bit lines (BL) and the reference bit lines (refBL1, refBL0) with the input of the (current) sense amplifier circuit 106 through activation of a control signal designated "column select" in FIG. 1. During a cell sensing operation, the sense amplifier circuit 106 maintains the voltage at the selected bitlines (and reference bitlines) constant while also measuring the current therethrough. The current through the selected bitlines will in turn be dependent upon the programming state "0" or "1" of the selected memory cells.

As is particularly shown in FIG. 1, a plurality of source follower transistors (e.g., $T_1$, $T_2$, $T_3$) are used to keep the voltage at the selected bitlines (and reference bitlines) approximately constant at the bitline clamp voltage VBLCLMP. It should be noted that since the schematic diagram of FIG. 1 is exemplary in nature for illustrative purposes, the actual number of bitlines and transistor devices will depend on the actual size and configuration of the MRAM device. In any event, the selected memory cells will cause a current flow through transistors $T_1$–$T_3$, which in turn requires a certain gate-to-source voltage VGS (since the transistors operate in the saturation region). Thus, the voltage at the selected bitlines (and reference bitlines) will be approximately constant at a voltage given by $V_{BLCLMP}$-$V_{GS}$.

The current through the source follower transistors $T_1$–$T_3$ is transformed into a corresponding voltage across a pair of load devices 112, 114 of the sense amplifier 106. A comparator 116 compares the voltage at the load device 112 of the regular cell 108 with the voltage at the load device(s) 114 of the reference bitlines 110a, 110b (or reference bitline) and creates a digital output signal (out) that is dependent on the programming state of the selected memory cell 108.

As indicated previously, a disadvantage generally associated with sense amplifiers results from the input offset current (voltage) created by mismatch in the individual sense amplifier devices. This mismatch may be schematically represented by an input offset current, which is indicated by the current source $I_{os}$ in FIG. 1. In the implementation of a high-precision sense amplifier, such as that of MRAM device 100, it is desirable to be able to reduce this offset by as much as possible. To a certain extent, this may be done through the introduction of more sophisticated layouts and device sizing. However, in order to even further decrease the offset of the sense amplifier 106, additional circuit techniques, such as calibration, may be used. While self-calibration (i.e., the sense amplifier periodically measures its mismatch and compensates through a feedback loop) might be one possible option in this regard, the resulting time penalty from performing calibration during each read cycle is too severe for a device with fast access times, such as the 1T1MTJ device of FIG. 1.

Therefore, in accordance with an embodiment of the invention, there is disclosed an method and apparatus for calibrating a current sense amplifier for MRAM devices. Briefly stated, the embodiments described herein employ a plurality of calibration trim transistors so as to selectively add a fixed number of devices in parallel with the devices associated with one or both sides of the comparator. In one embodiment, the effective width of the data and/or reference load devices are independently increased, while in another embodiment, offsets are adjusted by changing the effective width of NFET current mirror devices associated with the comparator and also isolated from the sense nodes.

Figure 2:
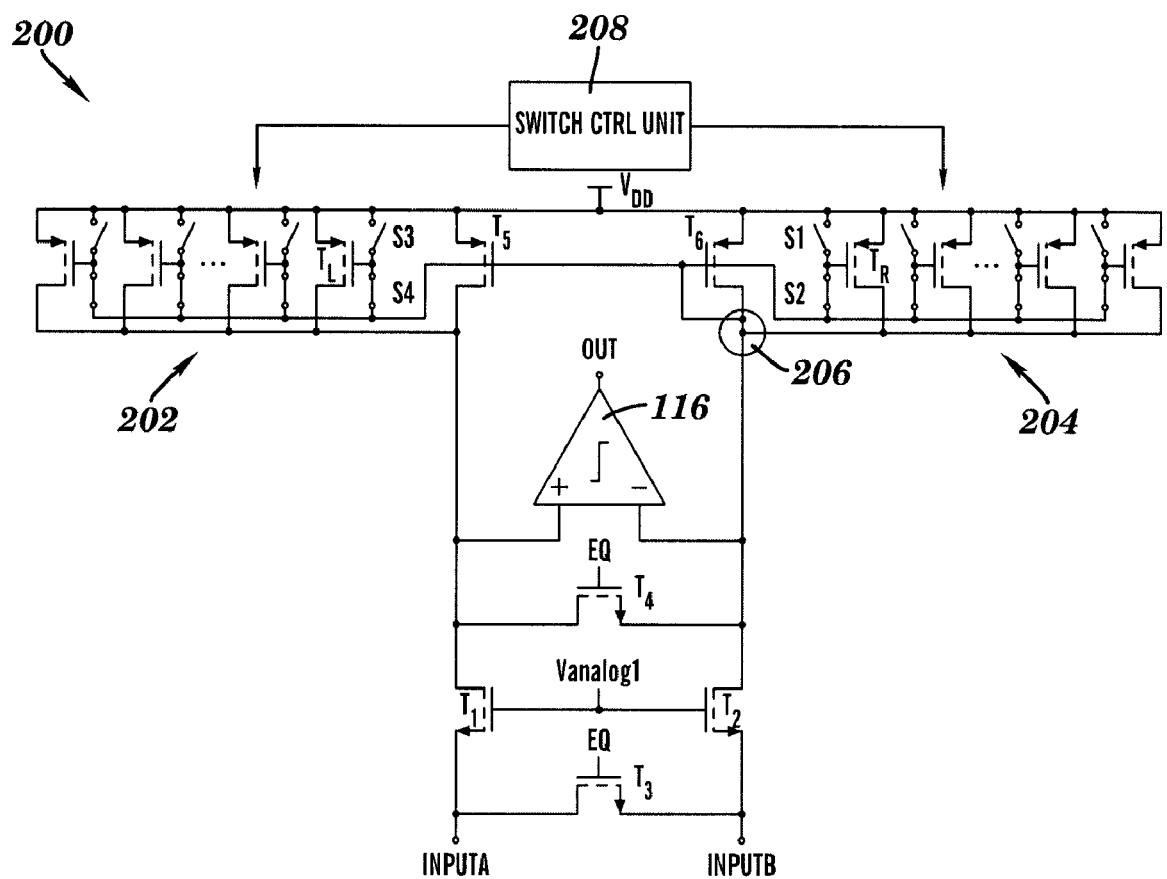
FIG. 2 is a schematic diagram of an apparatus for calibrating an MRAM sense amplifier, in accordance with an embodiment of the invention.

Referring now to FIG. 2, there is shown a schematic diagram of an MRAM sense amplifier 200, modified in accordance with one embodiment of the present invention. In the embodiment depicted, a data input to the sense amplifier 200 is labeled "Input A" while a reference input is labeled "Input B". It will be understood that the reference input can represent the net effect of a pair of reference storage cells, set to opposite data states as shown in FIG. 1. Transistors $T_1$ and $T_2$ represent the bitline clamping circuitry, in which the devices are configured as source followers and controlled by the input analog signal $V_{analog1}$ in FIG. 2. Also illustrated in FIG. 2 is a pair of equalizing transistors, $T_3$, $T_4$, that serve to equalize the voltage on the data line and reference lines prior to a sensing operation.

The load devices associated with each side of the comparator 116 (i.e., devices 112 and 114 of FIG. 1) are embodied as transistors $T_5$ and $T_6$ in FIG. 2. However, in order to implement the present calibration scheme, the sense amplifier 200 further includes a first plurality of trim transistors 202 in parallel with the data side load transistor $T_5$, and a second plurality of trim transistors 204 in parallel with the reference side load transistor $T_6$ (diode configuration). By selectively activating one or more of the transistors on a given side, the effective transistor width of the corresponding load transistor $T_5$, $T_6$, is increased so as to adjust the input voltage to the corresponding input(s) of the comparator 116.

Thus configured, the sense amplifier circuit 200 may selectively add additional transistor width, but not subtract it. Because the sense amplifier offset can have either a positive or negative sign associated therewith, trim transistors are provided on both the data and reference sides of the circuit to provide the capability of adjusting the sense amplifier circuit for both cases. As particularly shown in FIG. 2, the drain and source terminals of the data side trim transistors 202 (also labeled $T_L$) are connected in parallel with the source and drain terminals of $T_5$, while the drain and source terminals of the reference side trim transistors 204 (also labeled $T_R$) are connected in parallel with the source and drain terminals of $T_6$.

The state of a given trim transistor (i.e., either acting as a width-enhancing device or deactivated) is determined by the setting of a pair of switches associated with the gate terminal thereof. For example, the gate of each trim transistor TR on the reference side of the sense amplifier is coupled to an upper switch S1 and a lower switch S2, only one of which may be closed at a given time. In the case where the upper switch S1 is closed for a reference side trim transistor, the gate thereof is coupled to the system power supply terminal ($V_{DD}$), thus rendering the trim transistor non-conductive (for a PFET device). On the other hand, if S1 is open and S2 is closed, then the gate of that trim transistor is coupled to a common node 206, to which the gate of $T_6$ and the reference input of comparator 116 are also connected. This connection renders a given reference trim transistor in a conductive state.

In a similar manner, the gate of each trim transistor TL on the data side of the sense amplifier is coupled to an upper switch S3 and a lower switch S4, only one of which may be closed at a given time. In the case where the upper switch S3 is closed for a data side trim transistor, the gate thereof is coupled to $V_{DD}$, thus rendering the trim transistor non-conductive. If S3 is open and S4 is closed, then the gate of that data side trim transistor is coupled to common node 206, and thus rendered in a conductive state. It should be appreciated at this point that the switching configuration of the calibration transistors with regard to the individual activation and deactivation thereof is exemplary in nature, and that other circuit configurations for selectively activating and deactivating the trim transistors are also contemplated.

The actual calibration of the sense amplifier circuit 200 of FIG. 2 may be understood as follows. A certain fixed number, NR, of reference side trim transistors is initially activated in parallel to $T_6$ on the right side of the SA. On the other side, an identical number, NL, of data side trim transistors may be initially activated in parallel to $T_5$, such that NR=NL. In this case, the calibration trim transistors are equally balanced on both the data and reference sides of the sense amplifier (i.e., $T_5$ and $T_6$ have approximately the same effective widths). However, in order to compensate for an offset due to a sense amplifier device mismatch, the number of activated trim transistors on the data side (for example) of the sense amplifier can be reduced such that $0 \leq NL < NR$ in order to reduce the effective width of $T_5$ compared to $T_6$. On the other hand, in order to increase the effective width of $T_5$ compared to $T_6$, more trim transistors on the data side can be activated with respect to those on the reference side such that $0 \leq NR < NL$. In either instance, by adjusting the effective widths of the load transistors $T_5$, $T_6$, with respect to one another, compensation for positive or negative offsets may be achieved.

For better device matching it may be advantageous to use the same calibration trim transistors on the data and reference sides of the sense amplifier. It may also be desirable to use dummy switching devices in order to create the same time constants of the resulting RC network on both sides of the sense amplifier. Regardless of the specific implementation of the trim transistor gate switches, a digital switch control unit 208 is provided for programming the states of the transistor gate switches.

Figure 3:
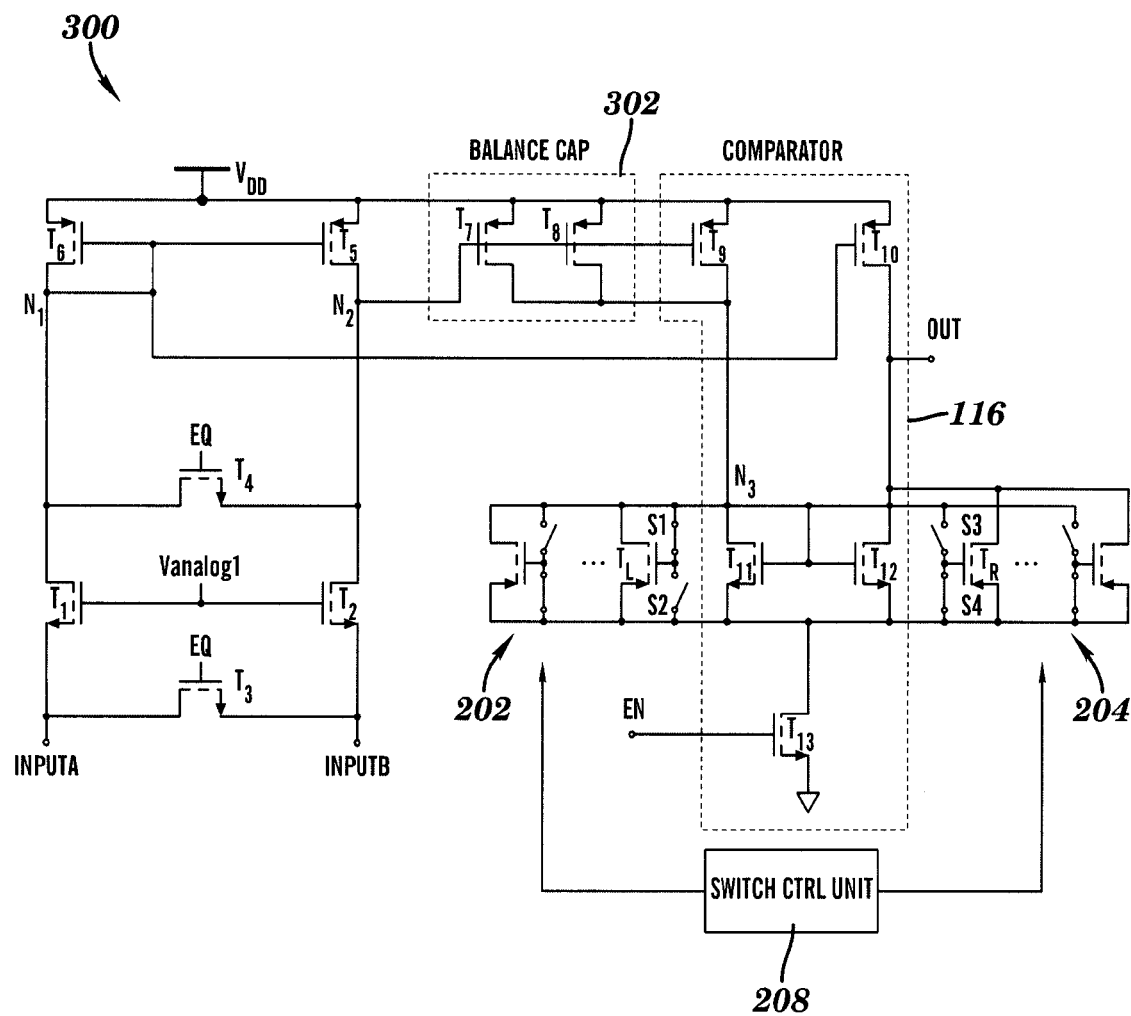
FIG. 3 is a schematic diagram of an apparatus for calibrating an MRAM sense amplifier, in accordance with an alternative embodiment of the invention.

In the event that a capacitive imbalance becomes a concern (e.g., due to different numbers of bitlines of memory cells coupled to the data and reference sides of the sense amplifier load devices), a different calibration scheme is also contemplated, as illustrated by the sense amplifier 300 in FIG. 3. In this embodiment, the calibration (addition of trim devices) is not implemented at the load devices $T_5$ and $T_6$, but rather within the comparator 116 itself. More specifically, FIG. 3 schematically illustrates the comparator 116, including input transistors $T_9$ and $T_{10}$, current mirror transistors $T_{11}$ and $T_{12}$, and enabling switch $T_{13}$ (activated by enabling signal "en"). The current sense amplifier 300 further includes an actively balanced capacitive load 302, including transistors $T_7$ and $T_8$, to match the capacitance presented on the load transistors $T_5$ and $T_6$. Additional details regarding the capacitive balancing of the embodiment of FIG. 3 may be found in U.S. application Ser. No. 10/937,155, filed Sep. 7, 2004, the contents of which are incorporated herein by reference in their entirety.

In order to compensate for positive or negative offsets as described above, the additional calibration transistors are configured in parallel with the current mirror devices $T_{11}$ and $T_{12}$. As is the case with the embodiment of FIG. 2, the trim transistors are added in parallel by engaging switches S1 (on the data side) and S3 (on the reference side), and are deactivated by engaging switches S2 (on the data side) and S4 (on the reference side). Thus, because the calibration trim transistors are not added at the input devices ($T_9$ and $T_{10}$) of the sense amplifier comparator 116, the capacitive loading of the load devices ($T_5$ and $T_6$) is not affected.

Again, the state of a given trim transistor (i.e., either acting as a width-enhancing device or deactivated) is determined by the setting of a pair of switches associated with the gate terminal thereof. For example, the gate of each trim transistor TR on the reference side of the sense amplifier is coupled to an upper switch S3 and a lower switch S4, only one of which may be closed at a given time. In the case where the upper switch S3 is closed for a reference side trim transistor, the gate thereof is connected to the gate terminals of $T_{11}$ and $T_{12}$, thus rendering the trim transistor conductive (for an NFET device).

On the other hand, if S3 is open and S4 is closed, then the gate of that trim transistor is connected in common with the source terminals of each trim transistor, as well as to the drain terminal of $T_{13}$. This connection renders a given reference trim transistor in a non-conductive state. In a similar manner, the gate of each trim transistor TL on the data side of the sense amplifier is coupled to an upper switch S1 and a lower switch S2, only one of which may be closed at a given time. In the case where the upper switch S1 is closed for a data side trim transistor, the trim transistor is conductive. If S1 is open and S2 is closed, then that data side trim transistor is rendered in a non-conductive state.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for calibrating an MRAM current sense amplifier, the method comprising:

configuring a first plurality of trim transistors in parallel with a first side of a current mirror device within a comparator, said first side of said current mirror device associated with a data side of the sense amplifier;

configuring a second plurality of trim transistors in parallel with a second side of said current mirror device, said second side associated with a reference side of the sense amplifier; and individually activating one or more of said first and said second plurality of trim transistors so as to compensate for a determined device mismatch with respect to the data and reference sides of the sense amplifier;

wherein said current mirror device further comprises a first transistor on said first side thereof and a second transistor on said second side thereof; and said first and second plurality of trim transistors, when activated, are configured to increase the respective widths of said first and second transistors of said current mirror device.

2. The method of claim 1, wherein each of said first and second plurality of trim transistors includes an upper switch and a lower switch associated with a gate terminal thereof, one of said upper and lower switches being used to activate the associated trim transistor, and the other of said upper and lower switches being used to deactivate the associated transistor.

3. The method of claim 2, wherein only one of said upper and lower switches is closed for a given trim transistor.

4. The method of claim 1, further comprising configuring a switch control unit configured setting the individual states of said first and second plurality of trim transistors.

5. The method of claim 1, wherein the number of activated transistors from one of said first and second plurality of trim transistors is greater than the number of activated transistors from the other of said first and second plurality of trim transistors.

6. The method of claim 1, further comprising configuring a capacitively balanced load for matching a load capacitance on a first load device associated with said data side of the sense amplifier and a second load device associated with said reference side of the sense amplifier.

7. A calibrated magnetic random access memory (MRAM) current sense amplifier, comprising:

a first plurality of trim transistors selectively configured in parallel with a first side of a current mirror device within a comparator, said first side of said current mirror device associated with a data side of the sense amplifier; and a second plurality of trim transistors selectively configured in parallel with a second side of said current mirror device, said second side associated with a reference side of the sense amplifier;

wherein said first and said second plurality of trim transistors are individually activated so as to compensate for device mismatch with respect to the data and reference sides of the sense amplifier;

said current mirror device further comprises a first transistor on said first side thereof and a second transistor on said second side thereof; and said first and second plurality of trim transistors, when activated, are configured to increase the respective widths of said first and second transistors of said current mirror device.

8. The MRAM sense amplifier of claim 7, wherein each of said first and second plurality of trim transistors includes an upper switch and a lower switch associated with a gate terminal thereof, one of said upper and lower switches being used to activate the associated trim transistor, and the other of said upper and lower switches being used to deactivate the associated transistor.

9. The MRAM sense amplifier of claim 8, wherein only one of said upper and lower switches is closed for a given trim transistor.

10. The MRAM sense amplifier of claim 7, further comprising a switch control unit configured for setting the individual states of said first and second plurality of trim transistors.

11. The MRAM sense amplifier of claim 7, wherein the number of activated transistors from one of said first and second plurality of trim transistors is greater than the number of activated transistors from the other of said first and second plurality of trim transistors.

12. The MRAM sense amplifier of claim 7, further comprising a capacitively balanced load configured for matching a load capacitance on a first load device associated with said data side of the sense amplifier and a second load device associated with said reference side of the sense amplifier.

* * * * *